United States Patent
Wu et al.

(10) Patent No.: US 10,128,331 B1
(45) Date of Patent: Nov. 13, 2018

(54) HIGH-VOLTAGE SEMICONDUCTOR DEVICE AND METHOD FOR MANUFACTURING THE SAME

(71) Applicant: Vanguard International Semiconductor Corporation, Hsinchu (TW)

(72) Inventors: Cheng-Tsung Wu, Taipei (TW); Shin-Cheng Lin, Tainan (TW); Wen-Hsin Lin, Jhubei (TW); Yu-Hao Ho, Keelung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 3 days.

(21) Appl. No.: 15/666,098

(22) Filed: Aug. 1, 2017

(51) Int. Cl.
| | |
|---|---|
| *H01L 29/06* | (2006.01) |
| *H01L 29/10* | (2006.01) |
| *H01L 29/78* | (2006.01) |
| *H01L 29/66* | (2006.01) |
| *H01L 21/761* | (2006.01) |

(52) U.S. Cl.
CPC ........ *H01L 29/0634* (2013.01); *H01L 21/761* (2013.01); *H01L 29/063* (2013.01); *H01L 29/0646* (2013.01); *H01L 29/1083* (2013.01); *H01L 29/1095* (2013.01); *H01L 29/66681* (2013.01); *H01L 29/7816* (2013.01); *H01L 29/7835* (2013.01)

(58) Field of Classification Search
CPC ........... H01L 29/7816; H01L 29/66681; H01L 29/0649; H01L 29/1095
See application file for complete search history.

(56) References Cited

U.S. PATENT DOCUMENTS

| | | | |
|---|---|---|---|
| 6,288,424 B1* | 9/2001 | Ludikhuize | ........... H01L 21/761 257/335 |
| 9,306,060 B1* | 4/2016 | Yang | ................... H01L 29/7823 |
| 2010/0052091 A1* | 3/2010 | Tanaka | ............. H01L 21/76202 257/501 |

(Continued)

FOREIGN PATENT DOCUMENTS

| | | |
|---|---|---|
| TW | 201251007 A1 | 12/2012 |
| TW | 201347182 A | 11/2013 |

(Continued)

*Primary Examiner* — A. Sefer
(74) *Attorney, Agent, or Firm* — Birch, Stewart, Kolasch & Birch, LLP (57) ABSTRACT

A high-voltage semiconductor device is provided. The device includes an epitaxial layer formed on a semiconductor substrate. The semiconductor substrate includes a first doping region having a first conductivity type. The epitaxial layer includes a body region that has a second conductivity type and a second doping region and a third doping region that have the first conductivity type. The second doping region and the third doping region are respectively on both opposite sides of the body region. A source region and a drain region are respectively in the body region and the second doping region. A gate structure is on the epitaxial layer. A fourth doping region having the second conductivity region is below the source region and adjacent to the bottom of the body region. The fourth doping region has a doping concentration greater than that of the body region.

18 Claims, 8 Drawing Sheets

(56) References Cited

U.S. PATENT DOCUMENTS

| | | | | |
|---|---|---|---|---|
| 2012/0175673 A1* | 7/2012 | Lee | ............... | H01L 27/0277 257/140 |
| 2013/0134510 A1* | 5/2013 | Yanagi | ............ | H01L 29/7816 257/337 |
| 2017/0317208 A1* | 11/2017 | Chin | ............ | H01L 29/7816 |

FOREIGN PATENT DOCUMENTS

| | | | |
|---|---|---|---|
| TW | 201607041 A | | 2/2016 |
| TW | I587402 B | | 6/2017 |

\* cited by examiner

HIGH-VOLTAGE SEMICONDUCTOR DEVICE AND METHOD FOR MANUFACTURING THE SAME

BACKGROUND

Field of the Disclosure

The present disclosure relates to a semiconductor technology, and in particular, it relates to a high-voltage semiconductor device that is capable of reducing the body effect and improving the breakdown voltage of high-voltage semiconductor devices.

Description of the Related Art

High-voltage semiconductor technology is applied to integrated circuits (ICs) with high voltage and high power. Traditional high-voltage semiconductor devices, such as lateral diffused MOSFETs (LDMOSFETs), have advantages that include cost effectiveness and process compatibility, and thus high-voltage semiconductor devices have been widely used in display driver IC devices and power-supply devices, and in fields such as power management, communications, autotronics, and industrial control.

In a traditional LDMOSFET, however, the source region is electrically connected to the underlying semiconductor substrate via the body region. Therefore, the body effect is induced to change the threshold voltage of the transistor when the source region is coupled to an internal circuit or resistor. As a result, the driving current of the transistor drops as higher voltage is applied to the source region, reducing the performance of the transistor.

Therefore, there is a need to develop a high-voltage semiconductor device and a method for manufacturing the same that are capable of addressing or mitigating the problems described above.

SUMMARY

In some embodiments of the disclosure, a high-voltage semiconductor device is provided. The high-voltage semiconductor device includes an epitaxial layer formed on a semiconductor substrate. A first doping region having a first conductivity type is formed in the semiconductor substrate. A body region having a second conductivity type is formed in the epitaxial layer and in contact with the first doping region. A second doping region and a third doping region that have the first conductivity type, are respectively formed in the epitaxial layer on both opposite sides of the body region and in contact with the body region. A source region and a drain region are respectively formed in the body region and the second doping region. A gate structure is disposed on the epitaxial layer. A fourth doping region having the second conductivity type is formed below the source region and adjacent to a bottom of the body region. The fourth doping region has a doping concentration greater than that of the body region.

In some embodiments of the disclosure, a method for fabricating a high-voltage semiconductor device is provided. The method includes forming a first doping region having a first conductivity type in a semiconductor substrate. An epitaxial layer is formed on the semiconductor substrate. A body region having a second conductivity type is formed in the epitaxial layer and a second doping region and a third doping region that have the first conductivity type are formed in the epitaxial layer. The body region is in direct contact the first doping region, and the second and third doping regions are respectively on both opposite sides of the body region and in direct contact the body region. A fourth doping region having the second conductivity type is formed adjacent to a bottom of the body region. The fourth doping region has a doping concentration greater than that of the body region. A gate structure is formed on the epitaxial layer. A source region is formed in the body region and above the fourth doping region and a drain region is formed in the second doping region.

BRIEF DESCRIPTION OF THE DRAWINGS

The present disclosure can be further understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

An exemplary embodiment of the present disclosure provides a high-voltage semiconductor device, such as an LDMOSFET, which utilizes an isolated doping region having a conductivity type that is different from that of the body region to isolate the body region from the substrate that has the same conductivity type as that of the body region, thereby reducing or eliminating the body effect. Moreover, such a high-voltage semiconductor device also utilizes a doping region having the same conductivity type as that of the body region to suppress the surface field below the body region, thereby preventing the breakdown voltage of the device from being reduced.

Figure 1A:
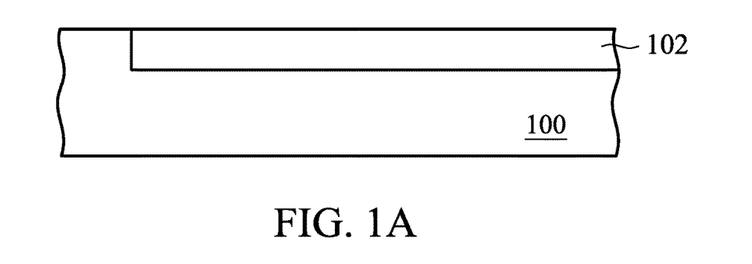
FIGS. 1A to 1G are cross sections of a method for fabricating a high-voltage semiconductor device according to an embodiment of the present disclosure.
Figure 1B:
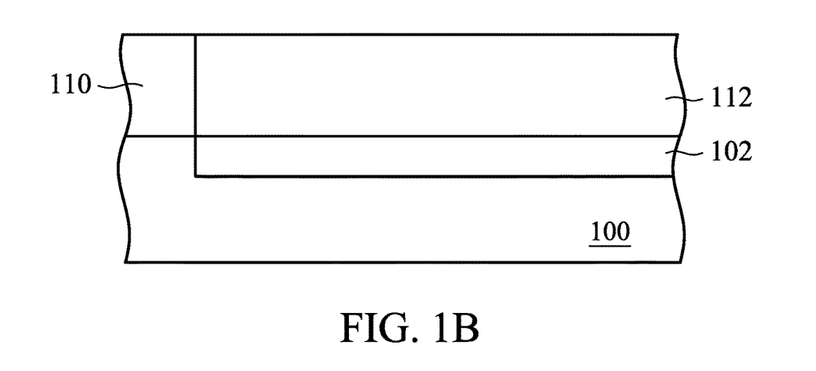
Figure 1C:
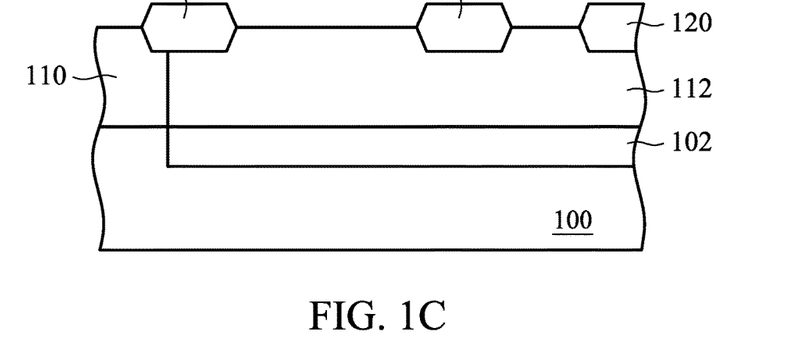
Figure 1D:
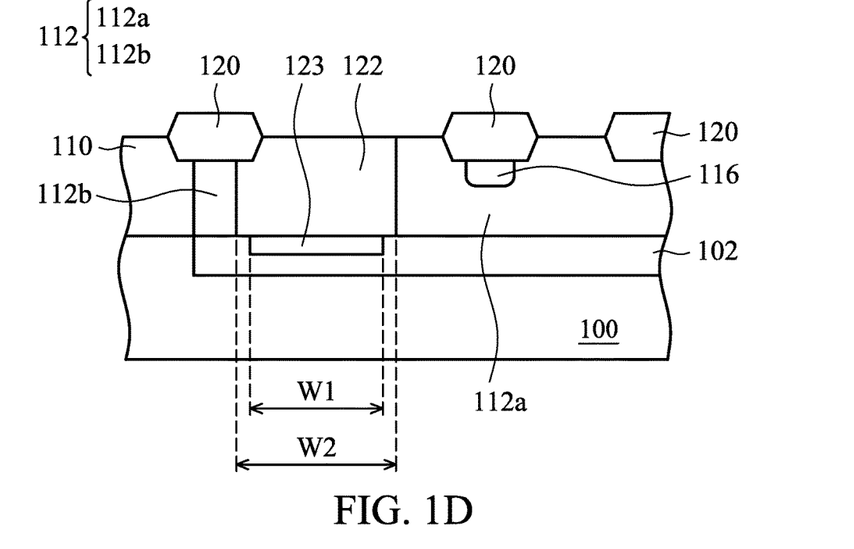
Figure 1E:
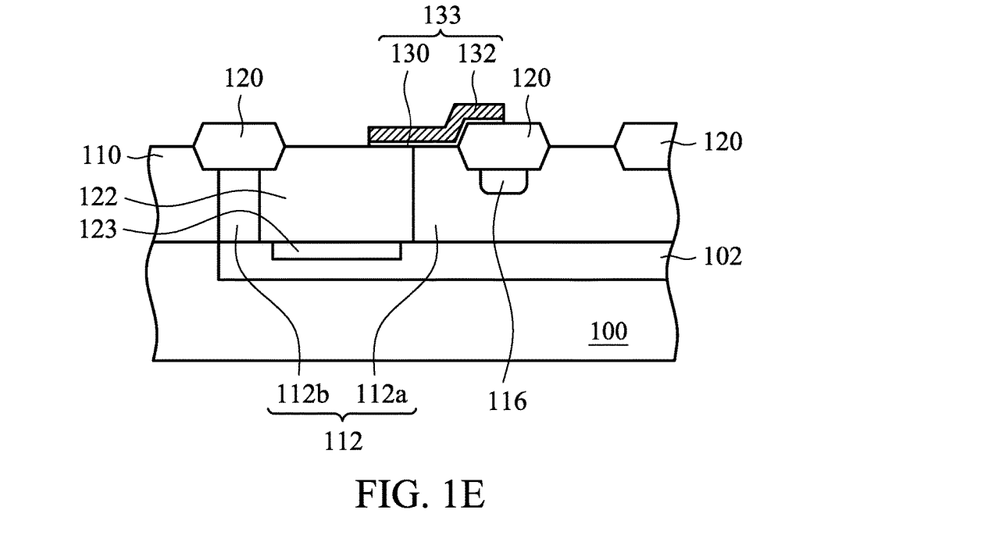
Figure 1F:
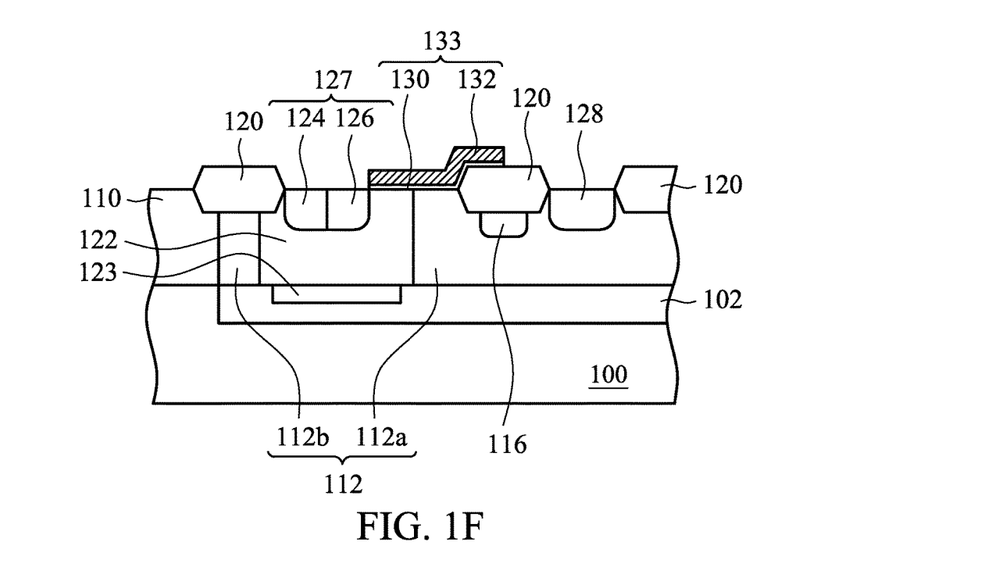
Figure 1G:
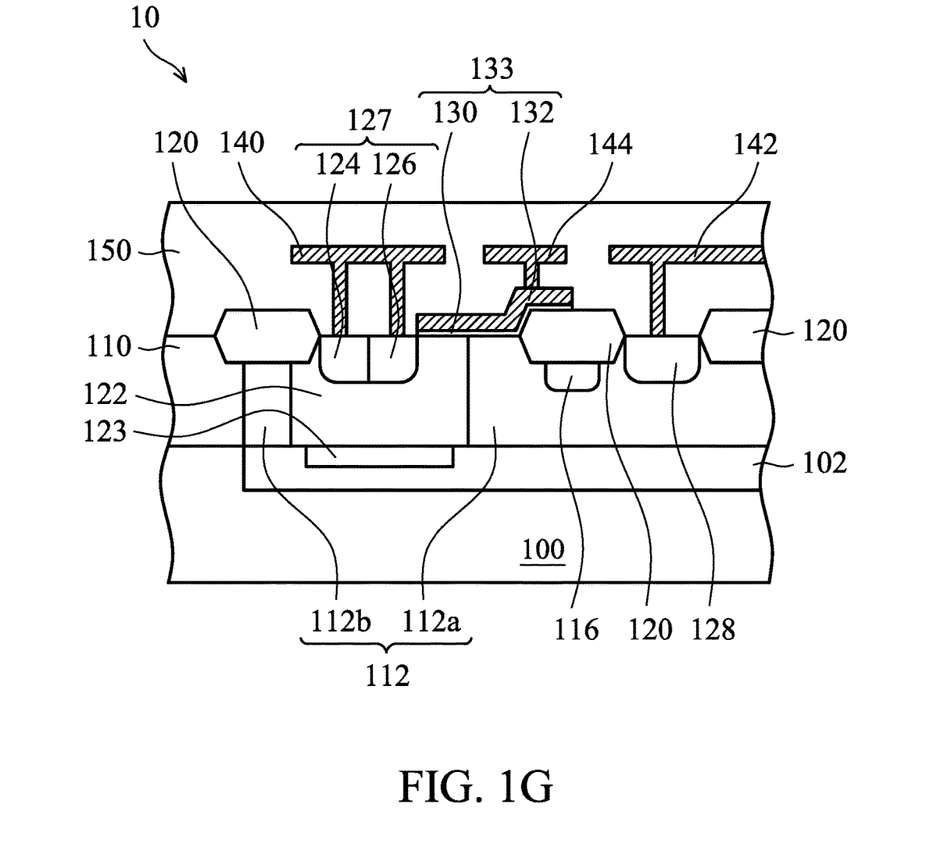

Refer to FIG. 1G, which illustrates a cross section of an exemplary embodiment of a high-voltage semiconductor device 10 according to the present disclosure. In some embodiments, the high-voltage semiconductor device 10 may be an LDMOSFET. In some embodiments, the high-voltage semiconductor device 10 includes a semiconductor substrate 100, such as a silicon substrate, a SiGe substrate, a bulk semiconductor substrate, a compound semiconductor substrate, a silicon-on-insulator (SOI) substrate, or another well-known semiconductor substrate, having a first conductivity type.

In some embodiments, the semiconductor substrate 100 includes a first doping region 102 (such as a high-voltage well region) adjacent to the top surface of the semiconductor substrate 100. The first doping region 102 has a first conductivity type that is different from a second conductivity type of the semiconductor substrate 100. For example, the first conductivity type is N-type and the second conductivity type is P-type. In some other embodiments, the first conductivity type is P-type and the second conductivity type is N-type.

In some embodiments, the high-voltage semiconductor device 10 further includes an epitaxial layer 110 that is formed on the semiconductor substrate 100 and has the second conductivity type. The epitaxial layer 110 includes a plurality of field insulating layers 120 that serves as an isolation structure. In some embodiments, the field insulating layer 120 is a field oxide. In one example, the field insulating layer 120 includes a local oxidation of silicon (LOCOS) structure. In some embodiments, the field insulating layer 120 includes a shallow trench isolation (STI) structure.

In some embodiments, the high-voltage semiconductor device 10 further includes a body region 122 having the second conductivity type and second and third doping regions 112a and 112b having the first conductivity type and the same doping concentration. The body region 122 is in the epitaxial layer 110 over the first doping region 102 and extends from the top surface of the epitaxial layer 110 to the bottom surface thereof, so that the bottom of the body region 22 may contact the first doping region 102. Moreover, the second doping region 112a and the third doping region 112b are in the epitaxial layer 110 on both opposite sides of the body region 122, respectively, to contact the body region 122.

In some embodiments, the second doping region 112a and the third doping region 112b are formed over the first doping region 102 and extend from the top surface of the epitaxial layer 110 to the bottom surface thereof, so that the bottoms of the second doping region 112a and the third doping region 112b may contact the first doping region 102.

In some embodiments, the first doping region 102, the second doping region 112a, and the third doping region 112b have the same doping concentration. In those cases, the first doping region 102, the second doping region 112a, and the third doping region 112b are well regions. In some embodiments, the second doping region 112a and the third doping region 112b in the epitaxial layer 110 may be two regions of a well region 112 that are separated by the body region 122. In some embodiments, the second doping region 112a and the third doping region 112b may be individual well regions formed in the epitaxial layer 110. In some embodiments, the well regions have a doping concentration in a range of about $1.0 \times 10^{14}$ to $1.0 \times 10^{15}$ ions/cm$^3$.

In some embodiments, the first doping region 102 has a doping concentration that is different from those of the second doping region 112a and the third doping region 112b. For example, the doping concentration of the first doping region 102 is lower than those of the second doping region 112a and the third doping region 112b. In some embodiments, the doping concentration of the first doping region 102 is in a range of about $1.0 \times 10^{14}$ to $5.0 \times 10^{15}$ ions/cm$^3$, and the doping concentrations of the second doping region 112a and the third doping region 112b are in a range of about $5.0 \times 10^{15}$ to $1.0 \times 10^{16}$ ions/cm$^3$. In some embodiments, the first doping region 102, the second doping region 112a, and the third doping region 112b serve as a drift region of the LDMOSFET.

In some embodiments, the high-voltage semiconductor device 10 further includes a fourth doping region 123 having the second conductivity type adjacent to the bottom of the body region 122. For example, the fourth doping region 123 is entirely within the first doping region 102 and contacts the bottom of the body region 122. In some embodiments, the fourth doping region 123 has a doping concentration greater than that of the body region 122. Namely, the minimum doping concentration of the dopants in the fourth doping region 123 is greater than the maximum doping concentration of the dopants in the body region 122. In some embodiments, the doping concentration of the fourth doping region 123 is in a range of about $1.1 \times 10^{16}$ to $5.0 \times 10^{16}$ ions/cm$^3$ and the doping concentration of the body region 122 is in a range of about $5.0 \times 10^{15}$ to $1.0 \times 10^{16}$ ions/cm$^3$.

In some embodiments, the fourth doping region 123 is a buried layer. In some embodiments, the fourth doping region 123 has a width W1 (indicated in FIG. 1D) less than or equal to the width W2 (indicated in FIG. 1D) of the body region 122. Moreover, the width W1 of the fourth doping region 123 is 0.5 to 0.9 times as wide as the width W2 of the body region 122.

In some embodiments, the high-voltage semiconductor device 10 further includes a source region 127, a drain region 128, and a gate structure 133. The source region 127 and the drain region 128 are respectively disposed in the body region 122 and the second doping region 112a. The source region 127 is formed on the fourth doping region 123 and formed of a doping region 126 having the first conductivity type and a heavy doping region (which serves as a body contact region) 124 having the second conductivity type. Moreover, the drain region 128 is merely formed of a heavy doping region having the first conductivity type. Furthermore, the gate structure 133 is disposed on the epitaxial layer 110 and covers a portion of the field insulating layer 120, in which this field insulating layer 120 is formed in the second doping region 112a between the source region 127 and the drain region 128. The gate structure 133 typically includes a gate dielectric layer 130 and a gate layer 132 on the gate dielectric layer 130.

In some embodiments, the high-voltage semiconductor device 10 may include a field reduction region 116 having the second conductivity type that is formed in the second doping region 112a below the field insulating layer 120 under the gate structure 133, so as to reduce surface field. In some embodiments, the field reduction region 116 has a doping concentration in a range of about $1.0 \times 10^{15}$ to $1.0 \times 10^{16}$ ions/cm$^3$.

In some embodiments, the high-voltage semiconductor device 10 further includes an interlayer dielectric (ILD) layer 150. Interconnect structures 140, 142, and 144 are in the ILD layer 150. In some embodiments, the interconnect structure 140 is electrically connected to the source region 127 to serve as a source electrode, the interconnect structure 142 is electrically connected to the drain region 128 to serve as a drain electrode, and the interconnect structure 144 is electrically connected to the gate structure 133 to serve as a gate electrode.

Figure 2A:
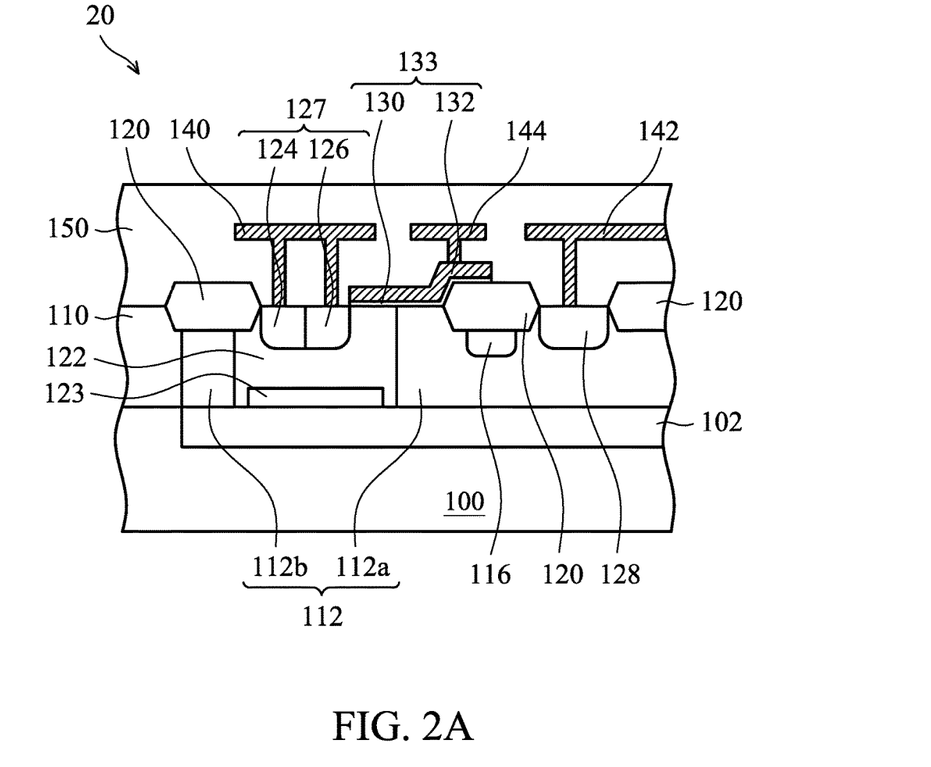
FIGS. 2A to 2D are cross sections of various high-voltage semiconductor devices according to some embodiments of the present disclosure.
Figure 2B:
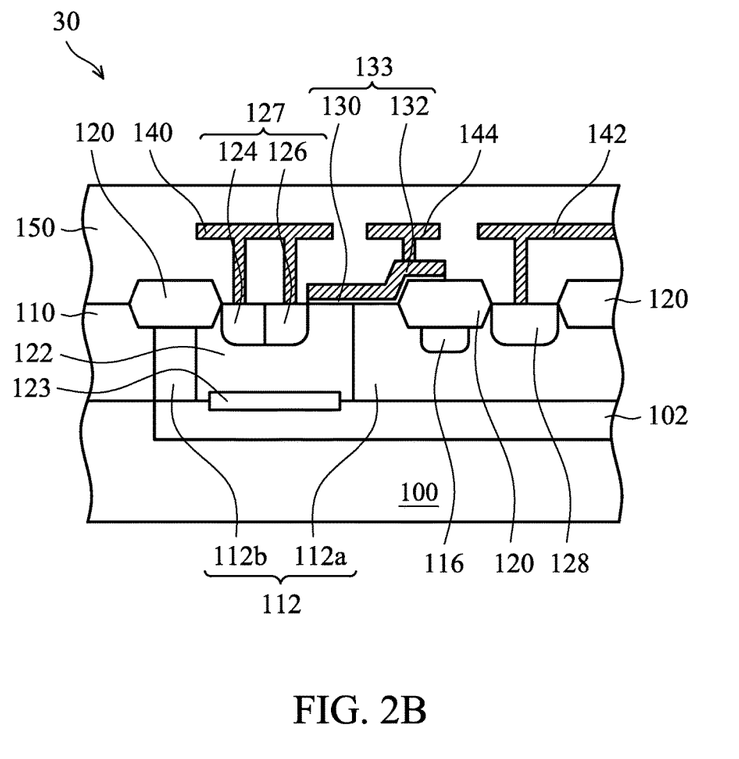

Refer to FIGS. 2A and 2B, which are cross sections of high-voltage semiconductor devices 20 and 30, respectively, according to some embodiments of the present disclosure. Elements in FIGS. 2A and 2B that are the same as or similar to those in FIG. 1G are not described again, for brevity. In FIG. 2A, the high-voltage semiconductor device 20 has a structure that is similar to that of the high-voltage semiconductor device 10 (shown in FIG. 1G). The difference is that in the high-voltage semiconductor device 20, the fourth doping region 123 adjacent to the bottom of the body region 122 is entirely formed within the body region 122 and contacts the first doping region 102, so that the fourth doping region 123 partially separates the body region 122 from the first doping region 102.

In FIG. 2B, the high-voltage semiconductor device 30 has a structure that is similar to that of the high-voltage semiconductor device 10 (shown in FIG. 1G). The difference is that the fourth doping region 123 adjacent to the bottom of the body region 122 is formed in the first doping region 102 and the body region 122.

Figure 2C:
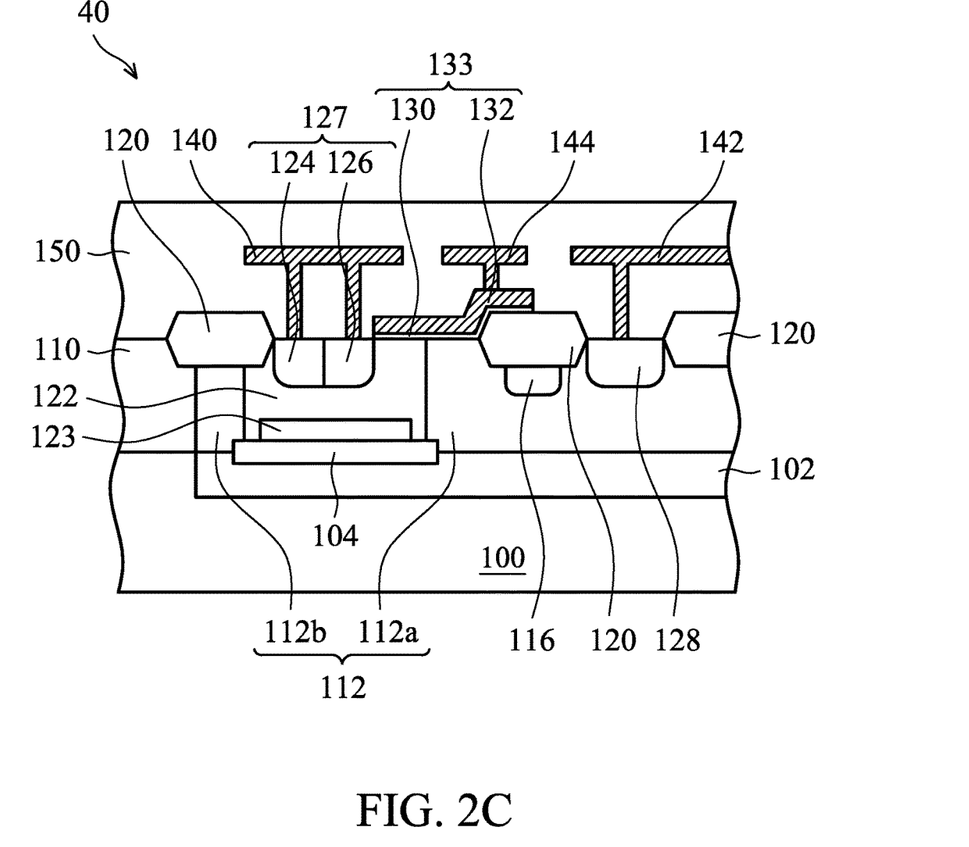

Refer to FIG. 2C, which is a cross section of a high-voltage semiconductor device 40 according to some embodiments of the present disclosure. Elements in FIG. 2C that are the same as or similar to those in FIG. 2A are not described again, for brevity. In some embodiments, the high-voltage semiconductor device 40 has a structure that is similar to that of the high-voltage semiconductor device 20 (shown in FIG. 2A). The difference is that the high-voltage semiconductor device 40 further includes a buried layer 104 having the first conductivity type that is formed between the body region 122 and the first doping region 102, so that the bottom of the body region 122 and that of the fourth doping region 123 contact the top surface of the buried layer 104. In some embodiments, the buried layer 104 has a greater doping concentration than that of the first doping region 102. For example, the doping concentration of the buried layer 104 is in a range of about $5.0 \times 10^{16}$ to $9.0 \times 10^{16}$ ions/cm$^3$.

Figure 2D:
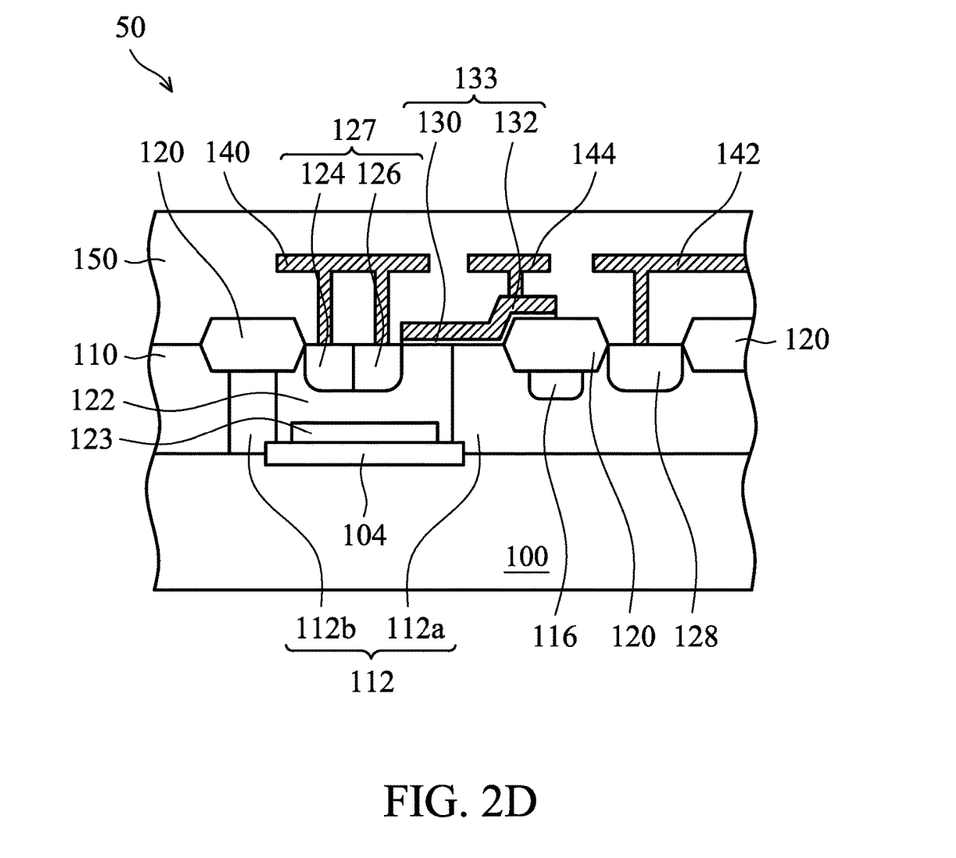

Refer to FIG. 2D, which is a cross section of a high-voltage semiconductor device 50 according to some embodiments of the present disclosure. Elements in FIG. 2D that are the same as or similar to those in FIG. 1G are not described again, for brevity. In some embodiments, the high-voltage semiconductor device 50 has a structure that is similar to that of the high-voltage semiconductor device 10 (shown in FIG. 1G). The difference is that the high-voltage semiconductor device 50 utilizes a buried layer 104 having the first conductivity type that is formed below the body region 122 to replace the first doping region 102 (as shown in the high-voltage semiconductor device 10). In other words, the first doping region disposed below the body region 122 in the high-voltage semiconductor device 50 is the buried layer 104. In this case, the second doping region 112a and the third doping region 112b may be well regions and the doping concentration of the buried layer 104 is greater than the doping concentrations of the well regions.

Next, refer to FIGS. 1A to 1G, which are cross sections of a method for fabricating a high-voltage semiconductor device 10 according to an embodiment of the present disclosure. In FIG. 1A, a semiconductor substrate 100 is provided. In some embodiments, the semiconductor substrate 100 may be a silicon substrate, a SiGe substrate, a bulk semiconductor substrate, a compound semiconductor substrate, an SOI substrate, or another well-known semiconductor substrate.

Next, a first doping region 102, such as a well region, may be formed in the semiconductor substrate 100 by an ion implantation process and a thermal process. The first doping region 102 is adjacent to the top surface of the semiconductor substrate 100. The first doping region 102 has a first conductivity type that is different from a second conductivity type of the semiconductor substrate 100, so as to serve as an isolated doping region to isolate the semiconductor substrate 100 from the subsequently formed body region. For example, the first conductivity type is N-type and the second conductivity type is P-type. In some other embodiments, the first conductivity type is P-type and the second conductivity type is N-type.

Next, Refer to FIG. 1B: an epitaxial layer 110 having the second conductivity type is formed on the semiconductor substrate 100 by an epitaxial growth process. Next, a doping region having the first conductivity type, such as a well region 112, may be formed in the epitaxial layer 110 by an ion implantation process and a thermal process. In some embodiments, the well region 112 and the first doping region 102 have the same doping concentration. In some other embodiments, the well region 112 has a different doping concentration than that of the first doping region 102.

Next, refer to FIG. 1C: field insulating layers 120 serving as isolation structures are formed in the epitaxial layer 110, in which at least one of the field insulating layers 120 is formed in the well region 112. In some embodiments, the field insulating layer 120 includes a LOCOS structure. In some other embodiments, the field insulating layer 120 includes an STI structure. Note that in some embodiments, the well region 112 may be formed in the epitaxial layer 110 after the field insulating layers 120 are formed.

Next, refer to FIG. 1D: a body region 122 having the second conductivity type may be formed in the well region 112 of the epitaxial layer 110 by an ion implantation process and a thermal process, thereby dividing the well region 112 into a second doping region 112a and a third doping region 112b that have the first conductivity type and the same doping concentration.

As shown in FIG. 1D, the body region 122 is formed in the epitaxial layer 110 on the first doping region 102 and extends from the top surface of the epitaxial layer 110 to the bottom surface thereof, so that the bottom of the body region 122 may contact the first doping region 102. Moreover, the second doping region 112a and the third doping region 112b are in the epitaxial layer 110 on both opposite sides of the body region 122, respectively, and contact the body region 122. In some embodiments, the second doping region 112a and the third doping region 112b are formed over the first doping region 102 and extend from the top surface of the epitaxial layer 110 to the bottom surface thereof, so that the bottoms of the second doping region 112a and the third doping region 112b may contact the first doping region 102.

In some other embodiments, the second doping region 112a and the third doping region 112b may be individually formed by the respective ion implantation process before or after forming the body region 122.

Next, refer to FIG. 1D again: a fourth doping region 123 having the second conductivity type is formed adjacent to the bottom of the body region 122 by an ion implantation process. For example, the fourth doping region 123 is formed in the first doping region 102 below the body region 122. In this case, the fourth doping region 123 is entirely within the first doping region 102 and contacts the bottom of the body region 122. In some embodiments, the fourth doping region 123 has a doping concentration greater than that of the body region 122. Namely, the minimum doping concentration of the dopants in the fourth doping region 123 is greater than the maximum doping concentration of the dopants in the body region 122.

In some embodiments, the fourth doping region 123 is a buried layer. In some embodiments, the fourth doping region 123 has a width W1 that is less than or equal to the width W2 of the body region 122. Moreover, the width W1 of the fourth doping region 123 is 0.5 to 0.9 times as wide as the width W2 of the body region 122.

Refer to FIG. 1D: a field reduction region 116 having the second conductivity type is optionally formed in the second doping region 112a below the field insulating layer 120, so as to reduce surface field. This field insulating layer 120 is disposed between the subsequently formed source and drain regions.

Next, refer to FIG. 1E: a gate structure 133 may be formed on the epitaxial layer 110 by a conventional MOS process, in which the gate structure 133 partially covers the field insulating layer 120 above the field reduction region 116.

The gate structure 133 typically includes a gate dielectric layer 130 and a gate layer 132 on the gate dielectric layer 130.

Next, refer to FIG. 1F: a source region 127 may be formed in the body region 122 and a drain region 128 may be formed in the second doping region 112a by an ion implantation process. The source region 127 may be formed of a heavy doping region 126 having the first conductivity type and a heavy doping region (which serves as a body contact region) 124 having the second conductivity type. Moreover, the drain region 128 may be merely formed of a heavy doping region having the second conductivity type.

Next, refer to FIG. 1G: a metallization layer may be formed on the epitaxial layer 110 by a conventional metallization process to cover the gate structure 133. As a result, the high-voltage semiconductor device 10 is completed. In some embodiments, the metallization layer may include an ILD layer 150 and interconnect structures 140, 142, and 144 in the ILD layer 150. In some embodiments, the interconnect structure 140 is electrically connected to the source region 127 to serve as a source electrode, the interconnect structure 142 is electrically connected to the drain region 128 to serve as a drain electrode, and the interconnect structure 144 is electrically connected to the gate structure 133 to serve as a gate electrode.

It should be understood that the high-voltage semiconductor devices 20, 30, 40, and 50 shown in FIGS. 2A to 2D respectively can be fabricated by a method that is the same as or similar to the method shown in FIGS. 1A to 1G.

According to the foregoing embodiments, a doping region having a conductivity type that is different from that of the body region is formed on the bottom of the body region. This doping region and those doping regions on both opposite sides of the body region constitute a continuous isolation structure to isolate the body region from the substrate in the high-voltage semiconductor device, in which the body region and the substrate have the same conductivity type. Accordingly, the body effect can be reduced or eliminated to prevent the driving current from falling as the voltage applied to the source region is increased. As a result, the performance of the high-voltage semiconductor device can be maintained or increased.

When there is an isolated doping region having a different conductivity type from that of the body region and formed below the body region and when the doping concentration of the field reduction region is reduced, the surface field below the body region is increased and thus the breakdown voltage of the device is lowered. According to the foregoing embodiments, however, there is a doping region having the same conductivity type as that of the body region and formed between the body region and the isolated doping region that is below the body region. Moreover, the doping concentration of this doping region is greater than that of the body region. Therefore, this doping region can assist the field reduction region to reduce the surface field below the body region, so as to mitigate or prevent the breakdown voltage of the high-voltage semiconductor device from lowering.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage semiconductor device, comprising:
an epitaxial layer formed on a semiconductor substrate;
a first doping region having a first conductivity type formed in the semiconductor substrate;
a body region having a second conductivity type formed in the epitaxial layer and in contact with the first doping region;
a second doping region and a third doping region that have the first conductivity type, respectively formed in the epitaxial layer on both opposite sides of the body region and in contact with the body region;
a source region and a drain region respectively formed in the body region and the second doping region;
a gate structure disposed on the epitaxial layer;
a fourth doping region having the second conductivity type formed below the source region and adjacent to a bottom of the body region, wherein the fourth doping region has a doping concentration greater than that of the body region; and
a buried layer having the first conductivity type formed between the body region and the first doping region, wherein the buried layer has a doping concentration greater than that of the first doping region.

2. The device as claimed in claim 1, wherein the fourth doping region has a width that is less than or equal to that of the body region.

3. The device as claimed in claim 1, wherein the fourth doping region comprises a buried layer.

4. The device as claimed in claim 1, wherein the fourth doping region is entirely formed within the first doping region.

5. The device as claimed in claim 1, wherein the fourth doping region is entirely formed within the body region.

6. The device as claimed in claim 1, wherein the fourth doping region is formed in the first doping region and the body region.

7. The device as claimed in claim 1, further comprising:
a field insulating layer formed in the second doping region between the source region and the drain region; and
a field reduction region having the second conductivity type formed in the second doping region below the field insulating layer.

8. The device as claimed in claim 1, wherein the first doping region, the second doping region, and the third doping region have the same doping concentration.

9. A method for fabricating a high-voltage semiconductor device, comprising:
forming a first doping region having a first conductivity type in a semiconductor substrate;
forming an epitaxial layer on the semiconductor substrate;
forming a body region having a second conductivity type in the epitaxial layer and forming a second doping region and a third doping region that have the first conductivity type in the epitaxial layer, wherein the body region is in direct contact the first doping region, and the second and third doping regions are respectively on both opposite sides of the body region and in direct contact the body region;
forming a fourth doping region having the second conductivity type adjacent to a bottom of the body region, wherein the fourth doping region has a doping concentration greater than that of the body region;
forming a gate structure on the epitaxial layer;
forming a source region in the body region and forming a drain region in the second doping region, wherein the source region is above the fourth doping region; and forming a buried layer having the first conductivity type between the body region and the first doping region, wherein the buried layer has a doping concentration greater than that of the first doping region.

10. The method as claimed in claim 9, wherein the fourth doping region has a width that is less than or equal to that of the body region.

11. The method as claimed in claim 9, wherein the fourth doping region comprises a buried layer.

12. The method as claimed in claim 9, wherein the fourth doping region is entirely formed within the first doping region.

13. The method as claimed in claim 9, wherein the fourth doping region is entirely formed within the body region.

14. The method as claimed in claim 9, wherein the fourth doping region is formed in the first doping region and the body region.

15. The method as claimed in claim 9, further comprising:
  forming a field insulating layer in the second doping region, wherein the field insulating layer is between the source region and the drain region and the gate structure covers a portion of the field insulating layer; and
  forming a field reduction region having the second conductivity type in the second doping region below the field insulating layer.

16. The method as claimed in claim 9, wherein the first doping region, the second doping region, and the third doping region have the same doping concentration.

17. A high-voltage semiconductor device, comprising:
  an epitaxial layer formed on a semiconductor substrate;
  a first doping region having a first conductivity type formed in the semiconductor substrate;
  a body region having a second conductivity type formed in the epitaxial layer and in contact with the first doping region;
  a second doping region and a third doping region that have the first conductivity type, respectively formed in the epitaxial layer on both opposite sides of the body region and in contact with the body region;
  a source region and a drain region respectively formed in the body region and the second doping region;
  a gate structure disposed on the epitaxial layer; and
  a fourth doping region having the second conductivity type formed below the source region and adjacent to a bottom of the body region, wherein the fourth doping region has a doping concentration greater than that of the body region,
  wherein the first doping region comprises a buried layer and the second and third doping regions are well regions, and wherein the buried layer has a doping concentration greater than those of the well regions.

18. A method for fabricating a high-voltage semiconductor device, comprising:
  forming a first doping region having a first conductivity type in a semiconductor substrate;
  forming an epitaxial layer on the semiconductor substrate;
  forming a body region having a second conductivity type in the epitaxial layer and forming a second doping region and a third doping region that have the first conductivity type in the epitaxial layer, wherein the body region is in direct contact the first doping region, and the second and third doping regions are respectively on both opposite sides of the body region and in direct contact the body region;
  forming a fourth doping region having the second conductivity type adjacent to a bottom of the body region, wherein the fourth doping region has a doping concentration greater than that of the body region;
  forming a gate structure on the epitaxial layer; and
  forming a source region in the body region and forming a drain region in the second doping region, wherein the source region is above the fourth doping region,
  wherein the first doping region comprises a buried layer and the second and third doping regions are well regions, and wherein the buried layer has a doping concentration greater than those of the well regions.

* * * * *